United States Patent
Yan et al.

(10) Patent No.: US 6,630,273 B2
(45) Date of Patent: Oct. 7, 2003

(54) METHOD TO FABRICATE EXTREME ULTRAVIOLET LITHOGRAPHY MASKS

(75) Inventors: Pei-Yang Yan, Saratoga, CA (US); Mark Thiec-Hien Tran, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/971,862

(22) Filed: Oct. 4, 2001

(65) Prior Publication Data

US 2002/0012855 A1 Jan. 31, 2002

Related U.S. Application Data

(63) Continuation of application No. 09/160,740, filed on Sep. 25, 1998, now Pat. No. 6,355,381.

(51) Int. Cl.[7] .................................................. G03F 9/00
(52) U.S. Cl. ........................................................ 430/5
(58) Field of Search .............................. 430/5, 322, 323, 430/324

(56) References Cited

U.S. PATENT DOCUMENTS

| | | | |
|---|---|---|---|
| 4,393,127 A | | 7/1983 | Greschner et al. |
| 4,965,173 A | | 10/1990 | Gould |
| 5,464,711 A | | 11/1995 | Mogab et al. |
| 5,631,109 A | * | 5/1997 | Ito ................................ 430/5 |
| 5,670,297 A | | 9/1997 | Ogawa et al. |
| 5,672,243 A | * | 9/1997 | Hsia et al. ............. 156/659.11 |
| 5,897,977 A | | 4/1999 | Carcia et al. |
| 5,908,719 A | | 6/1999 | Guckel et al. |
| 5,942,760 A | | 8/1999 | Thompson et al. |
| 5,958,629 A | | 9/1999 | Yan et al. |

OTHER PUBLICATIONS

Mirkarimi, et al. "Advances in the Reduction and Compensation of Film Stress in High–reflectance Multilayer Coatings for Extreme Ultraviolet Lithography," SPIE, vol. 3331, pp. 133–148.

Takenaka, et al., "Evaluation of Mo–Based Multilayer EUV Mirrors," OSA Proceedings on Extreme Ultraviolet Lithography, 1994, vol. 23, p. 26–32.

Yan, Pei–yang, et al., "EUV Mask Absorber Defect Repair with Focused Ion Beam," Intel Corporation, Santa Clara, CA and Lawrence Livermore National Laboratory, Livermore, CA., Undated, 8 pages.

* cited by examiner

*Primary Examiner*—Mark F. Huff
*Assistant Examiner*—Saleha R. Mohamedulla
(74) *Attorney, Agent, or Firm*—Blakely, Sokoloff, Taylor & Zafman LLP

(57) ABSTRACT

A process for fabricating a photolithograpic mask by etching a silicon layer and then forming an absorbent silicide. A protective oxide layer is sputtered on a substrate and is then covered by a layer of silicon. Silicon members and reflective regions are formed from the layer of silicon. Defects in the silicon members are repaired. A layer of nickel is deposited over the silicon members and the reflective regions. The silicon members are converted into an absorbent silicide at a low temperature. The remaining metal and the protective oxide layers are removed resulting in a photolithograpic mask.

5 Claims, 5 Drawing Sheets

METHOD TO FABRICATE EXTREME ULTRAVIOLET LITHOGRAPHY MASKS

RELATED APPLICATIONS

The present patent application is a continuation of prior application Ser. No. 09/160,740, filed Sep. 25, 1998, now U.S. Pat. No. 6,355,381, entitled "A Method To Fabricate Extreme Ultraviolet Lithography Masks", which is a related application to U.S. Pat. No. 5,936,737, filed Dec. 22, 1997, entitled "A Method Eliminating For Final EUV Mask Repairs In The Reflector Region;" and Ser. No 08/995,867, Filed Dec. 22, 1997, now U.S. Pat. No. 5,928,817, entitled "A Method Of Protecting An EUV Mask From Damage And Contamination;" and Ser. No. 08/995,949, filed Dec. 22, 1997, now U.S. Pat. No. 5,958,629, entitled "Using Thin Films As Etch Stop In EUV Mask Fabrication Process". These co-pending applications are assigned to the assignee of the present invention.

BACKGROUND OF THE INVENTION

1. Field of the Invention

The present invention relates to the field of mask fabrication for semiconductor processing.

2. Prior Art

Conventional Extreme Ultraviolet Lithography (EUVL) masks are fabricated using metal films to create desired mask patterns. The process of fabricating the mask generally involves forming a metal layer on a substrate, forming a photoresist layer on the metal layer, patterning the photoresist, and etching the metal layer in alignment with the patterned photoresist.

There are several problems associated with metal film masks. For one, it becomes more difficult to transfer accurate images onto a photoresist layer as line widths become smaller. This occurs in part because the etched metal lines on the mask have rough vertical sidewalls. The vertical sidewalls are rough because metal films have relatively large grains. When the metal is etched, the grains protrude from the sidewall. These protrusions become more pronounced as the critical dimension becomes smaller since the grain size remains relatively constant. Current processing methods compound the problem since they cannot control metal line critical dimension variation down to less than 10% of the critical dimension. Consequently, as the critical dimension becomes smaller, grain size will have a greater affect on the image transferred to the photoresist.

There is also a need to repair defects that occur in masks. There are typically two types of defects. The first are clear defects, which form when mask material is inadvertently removed prior to the etch step, causing an unwanted opening in the absorber structure. The second are opaque defects, which form when excess mask material or other debris remain following the etch step, causing intrusions in the pattern openings. Both types of defects must be repaired for an accurate mask image to be transferred onto a photoresist layer.

Thus, what is needed is a method to form a photolithographic mask that will transfer accurate images as critical dimensions become smaller and a method to repair defects in such photolithographic masks.

SUMMARY OF THE INVENTION

A method of fabricating a photolithograpic mask is disclosed. First, an etch stop layer is formed over a substrate. Then, a silicon layer is formed over the etch stop layer. Next, a plurality of silicon members and reflective regions are formed from the silicon layer where the reflective regions reflect electromagnetic energy at a predetermined wavelength. Finally, the silicon members are converted into absorption members by forming a nickel silicide that absorbs the predetermined wavelength of electromagnetic energy.

DESCRIPTION OF THE PREFERRED EMBODIMENTS

A novel method of fabricating a photolithograpic mask is described. In the following description specific details are set forth in order to provide a thorough understanding of the present invention. However, it will be apparent to one skilled in the art that the present invention may be practiced without these specific details. In other instances, well-known processing steps are not discussed in detail in order not to obscure the present invention.

Figure 1:
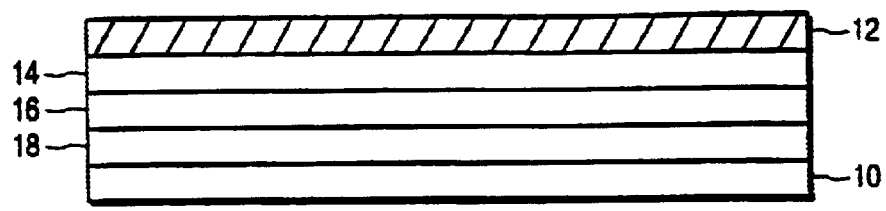
FIG. 1 is a cross-sectional elevation view of a mask substrate covered with an etch stop layer.

FIG. 1 illustrates an oxide layer 12 formed over a reflective substrate 10. In embodiment of the invention, the reflective substrate 10 has alternating layers of silicon and molybdenum. The layer directly below the oxide layer 12 is a first silicon layer 14. Directly under the first silicon layer 14 is a first molybdenum layer 16. Directly under the first molybdenum layer 16 is a second silicon layer 18. The pattern of alternating layers of silicon and molybdenum repeats so that there are often 40 silicon layers and 40 molybdenum layers. The silicon layers and molybdenum layers are approximately 4 nanometers and 3 nanometers thick, respectively. It is to be appreciated that the reflective substrate 10 can have a different number of layers and each layer may be of different a thickness. It is also to be appreciated that the layers of the reflective substrate 10 can be formed using any combination of reflective and non-reflective materials.

The substrate 10 described in the embodiment above is fabricated so that it will properly reflect a predetermined wavelength of electromagnetic energy. It is the reflected energy from the reflective regions of the substrate that are used to expose the photoresist layer on a wafer once the mask is in use. As such, it is important that the integrity of the reflective substrate 10 is maintained during any subsequent processing steps. One way in which the integrity of the reflective substrate 10 can be compromised is by exposing it to a temperature that will cause the alternating layers of silicon and molybdenum to convert into a silicide. If the reflective substrate 10 is transformed into a silicide, the incident electromagnetic energy will not be properly reflected and the performance of the reflective mask will be severely degraded. The silicon and molybdenum layers will convert into a silicide if exposed to a temperature of approximately 400° or higher. However, even at temperatures of greater than 200° C. other effects such as changes in density can cause degradation in mask performance. See, for example, FIG. 3 on page 139 of "Advances In The Reduction And Compensation Of Film Stress In High-Reflectance Multilayer Coatings For Extreme Ultraviolet Lithography," *SPIE*, Vol. 3331; and "Evaluation of Mo-Based Multilayer EUV Mirrors," *OSA Proceedings on Extreme Ultraviolet Lithography*, 1994, Vol. 23, beginning at page 26. Thus, in the preferred embodiment, the reflective substrate 10 cannot be subjected to any processes that take place at a temperature of approximately 200° C. or higher.

Accordingly, the oxide layer 12 is sputtered onto the reflective substrate 10. In one embodiment of the invention, the sputtering process takes place at approximately 80° C. This temperature allows the oxide layer 12 to be deposited onto the reflective substrate 10 without damaging the integrity of the reflective substrate 10. Other processes, such as typical chemical vapor deposition, cannot be used to deposit the oxide layer 12 onto the reflective substrate 10 since such processes are often performed at temperatures which will cause the reflective substrate 10 to transform into silicide layers. (Low temperature oxidation (LTO) may be useful, however, for forming this oxide layer but it is not currently preferred.) In one embodiment of the invention, the oxide layer 12 is silicon dioxide and is formed to a thickness of approximately 50 angstroms. It is to be appreciated that the oxide can be any one of a plurality of oxides and can be formed to a different thickness.

Figure 2:
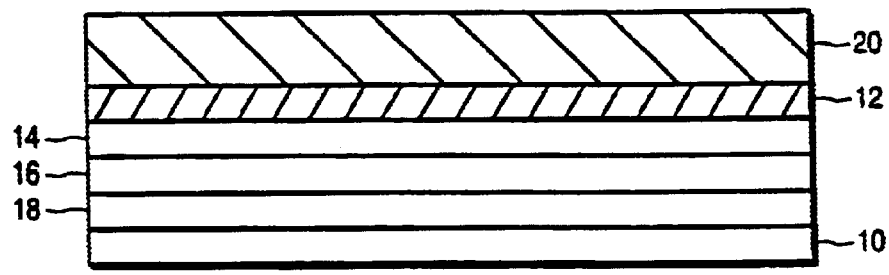
FIG. 2 illustrates the substrate of FIG. 1 after a silicon layer has been formed over the etch stop layer.

In the next step, a layer of silicon 20 is deposited over the oxide layer 12 as shown in FIG. 2. In one embodiment of the invention, the layer of silicon 20 is sputtered onto the oxide. Like the oxide layer 12, the layer of silicon 20 is sputtered at a low temperature so that the integrity of the substrate 10 is maintained. Other processes, such as chemical vapor deposition, cannot be used to deposit the layer of silicon 20 over the oxide layer 12 since such processes often take place at temperatures that will compromise the integrity of the substrate 10.

The thickness that the layer of silicon 20 is determined by the absorption factor of the silicide that is formed from the layer of silicon 20 in a later step. The absorption factor is a measure of how well a silicide of a given thickness will absorb a predetermined wavelength of electromagnetic energy. (For the EUV energy used for the embodiment under discussion the wavelength is approximately 13.4 nanometers.) For example, suppose the silicon layer is grown to 600 angstroms and the wavelength of electromagnetic energy that will be used is 10 nanometers. A silicide of metal A formed from the silicon layer may sufficiently absorb the incident electromagnetic energy, whereas a silicide of metal B may not sufficiently absorb the incident electromagnetic energy. Thus, the layer of silicon using metal B to form the silicide must be thicker than the layer of silicon using metal A to form the silicide to achieve the same amount of electromagnetic energy absorption. In one embodiment, the silicon layer 20 is approximately 500 nanometers thick where nickel is used as the metal for the extreme UV mask.

Figure 3:
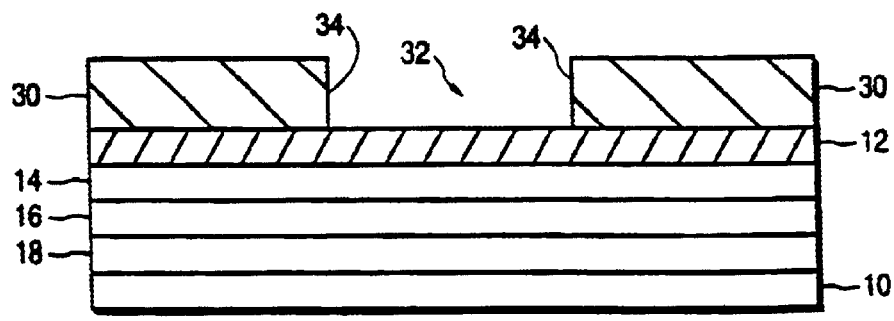
FIG. 3 illustrates the substrate of FIG. 2 after the photoresist has been patterned and the silicon layer has been etched. The resulting structure includes silicon members and a reflective region.

After the silicon layer 20 has been formed, it is patterned and etched using processes well-known in the art. Often these reflective masks are 4× as large as the ultimate image cast onto the wafer and consequently ordinary processing can be used to pattern the layer 20. A plurality of silicon members 30 and a plurality of reflective regions 32 are formed from the patterning and etching of layer 20 as shown in FIG. 3. The silicon members 30 and the reflective regions 32 define the regions that will absorb electromagnetic energy and the regions that will reflect electromagnetic energy, respectively.

It is, however, important that the dimensions of the etched silicon members 30 are very close to the dimensions defined by the patterning process. This is necessary since the silicon members 30 and the reflective regions 32 define the regions that will absorb electromagnetic energy and the regions that will reflect electromagnetic energy. Ideally, the dimensions of the etched silicon members 30 have the dimensions defined by the patterning process. Further, the silicon members ideally have vertical sidewalls 34 that are smooth and perpendicular to the top surface of the etch stop layer 12.

One of the advantages to silicon when compared to other materials such as metals, is that it can be etched within very small tolerances. This is in part due to the relatively small grain size of silicon. The vertical sidewalls 34 of etched silicon are relatively smooth. As a result, the dimensions of the silicon members 30 are very close to the dimensions defined by the patterning process. On the other hand, if a layer of metal is etched, the vertical sidewalls 34 generally have large grains protruding into the reflective regions 32. This causes the dimensions defined by the pattering process to significantly differ form the dimensions of the silicon members.

Figure 4:
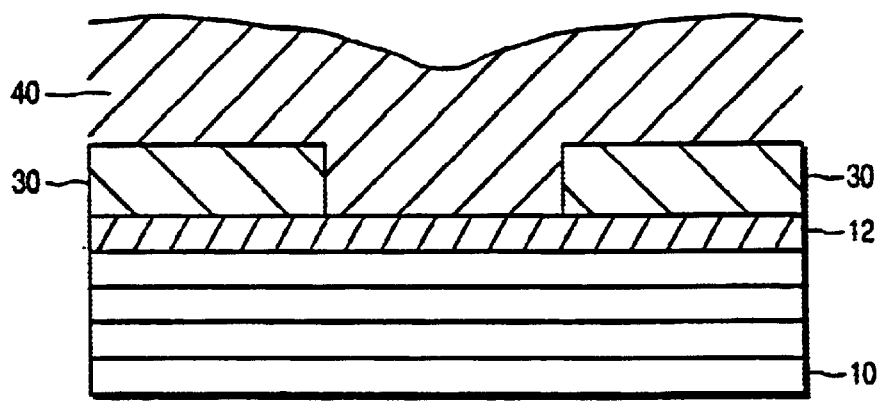
FIG. 4 illustrates the substrate of FIG. 3 after a layer of metal has been deposited.

A disadvantage of using silicon is that silicon cannot absorb a sufficient amount of electromagnetic energy to act as a mask. This problem is solved by forming a silicide from the silicon members 30, which can absorb a sufficient amount of electromagnetic energy to act as a mask. In one embodiment of the invention, a silicide is formed by first sputtering a layer of nickel 40 over the silicon members 30 and the reflective regions 32 as shown in FIG. 4. The layer of nickel 40 is formed to a thickness of approximately 600 angstroms or in the range of 500 to 800 angstroms. It is to be appreciated that the layer of nickel can be formed to a different thickness. Generally, however, the nickel layer is approximately the same thickness, or thicker than the silicon to provide sufficient nickel for the silicide.

Figure 5:
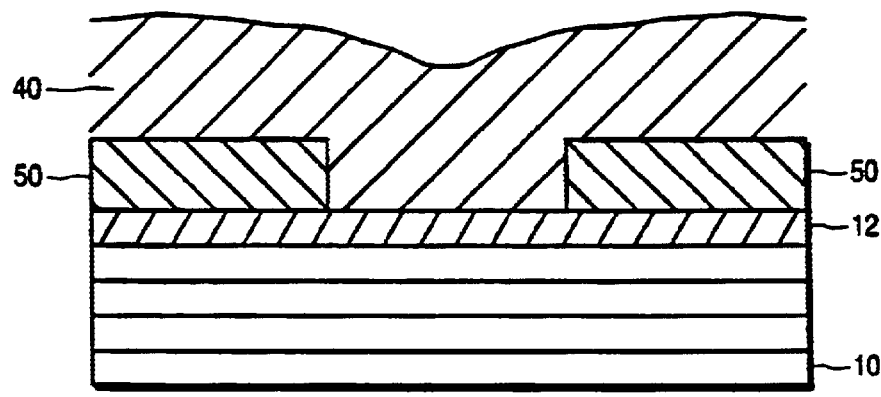
FIG. 5 illustrates the substrate of FIG. 4 after the silicon members have been converted into the absorption members.
Figure 6:
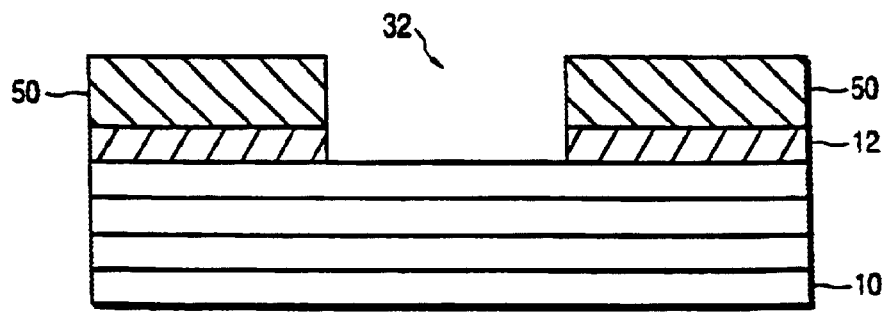
FIG. 6 illustrates the substrate of FIG. 5 after the metal and the oxide etch step layer have been etched.

After the layer of nickel has been formed over the silicon members 30 and the reflective regions 32, the silicon members 30 are converted into absorbing members 50. This is shown in FIG. 5. The absorbing members are formed by subjecting the substrate of FIG. 4 to a relatively low temperature for silicide formation. This process converts the silicon members 30 into silicides or absorbing members 50. In a preferred embodiment of the invention, the low temperature silicidation takes place at approximately 150° C. but below approximately 200° C.

There are several advantages to using nickel, as opposed to other metals, to form the absorbing members 50. First, the dimensions of the silicon members 30 do not change significantly when they are transformed into a nickel silicide. In contrast, the dimensions of the silicon members would change significantly if the silicide were formed from other metals.

Another advantage to nickel is that a nickel silicide can be formed at a low temperature. Other metals must be subjected to higher temperatures for silicides to form and exhibit more despacing. This is important since the substrate 10 will also transform into a silicide if subjected to a higher temperature. A silicide of nickel will form at a temperature that is lower than the temperature in which the molybdenum in the substrate 10 will form a silicide. Thus, the nickel silicide can be formed without compromising the integrity of the substrate 10. Also, nickel has a high absorption factor and its silicide likewise has a high absorption factor when compared to other metals.

In the next step, excess nickel from the layer of metal 40 that was not converted into a silicide is removed by wet etching. All the excess metal in the reflective region 32 is removed by this etching. The metal that remains on the absorbing members 50 is also removed. In addition, after the excess metal is removed, the portion of the oxide layer 12 that is located between the reflective region 32 and the substrate 10 is etched.

Figure 7:
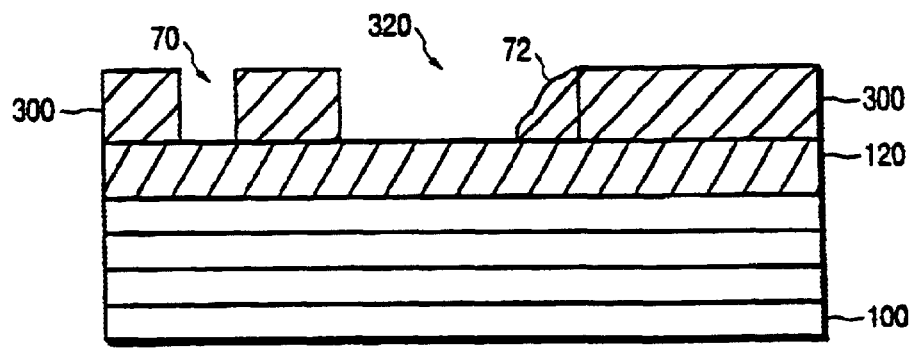
FIG. 7 illustrates the substrate of FIG. 2 after the photoresist has been patterned and the silicon layer has been etched. The resulting structure includes silicon members and a reflective region. It also shows a clear defect in the silicon member and a silicon artifact that can result in an opaque defect in the reflective region.

In another embodiment of the present invention, defects in the mask are repaired during the fabrication process. FIG. 7 shows a substrate 100 similar to that of FIG. 3. However, in this embodiment the etch stop layer 120 is formed to a thickness of approximately 500 angstroms, a thickness sufficient enough to allow "opaque" defects 72 to be repaired without damaging the substrate 100. This mask is otherwise formed in the same manner as described above in connection with FIGS. 1–6. In addition, FIG. 7 shows a clear defect 70 in an absorption member 300 and an opaque defect 72 in the reflective region 320. Clear defect 70 forms when mask material is inadvertently removed. Opaque defects 72 form when mask material or debris that acts as a masking material is present. Both types of defects are undesirable and degrade the quality of the mask. Since the mask is most often used for each die on the wafer these defects are repeated. Thus, steps are taken to repair the defects.

Figure 8:
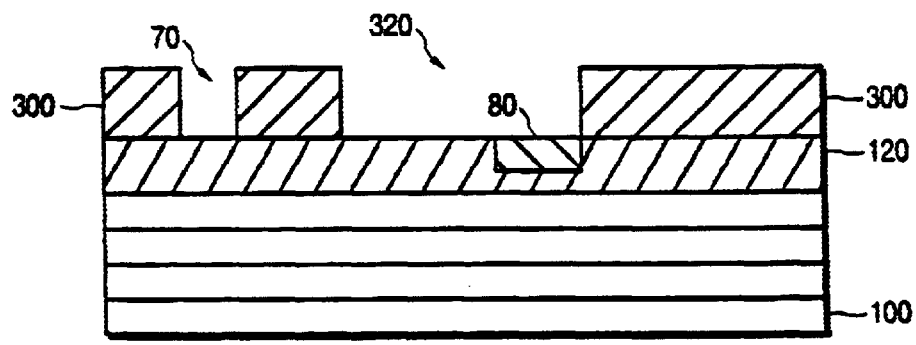
FIG. 8 illustrates the substrate of FIG. 7 after the opaque defect has been repaired in the reflective region.
Figure 9:
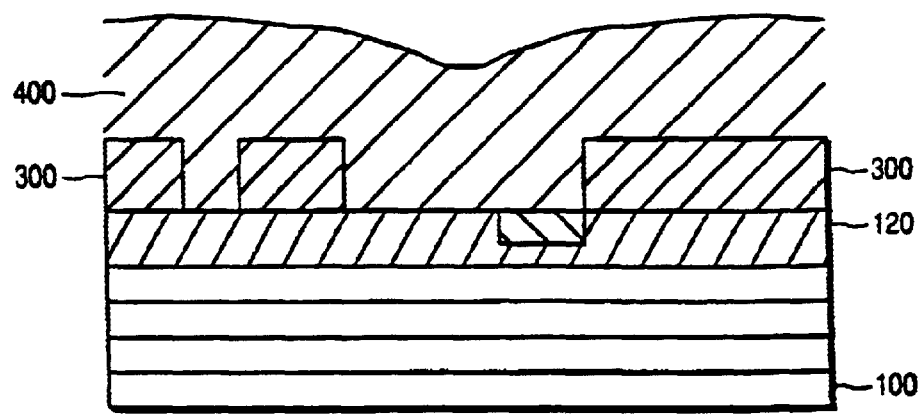
FIG. 9 illustrates the substrate of FIG. 8 after a layer of metal has been deposited.

FIG. 8 illustrates the substrate of FIG. 7 after the opaque defect 72 has been repaired. The opaque defect 72 can be repaired by placing the mask into a focused-ion beam system, where a stream of gallium ions remove the undesired material. Although the ions remove the opaque defect 72, they can also damage the etch stop layer 120. The damaged area shown in FIG. 8 is called a gallium stain 80. As explained above, the etch stop layer 120 is formed to a thickness such that a gallium stain will not reach the substrate 100. This is important because a gallium stain may distort the image transferred to a substrate when the mask is in use if it contacts the substrate 100.

Figure 10:
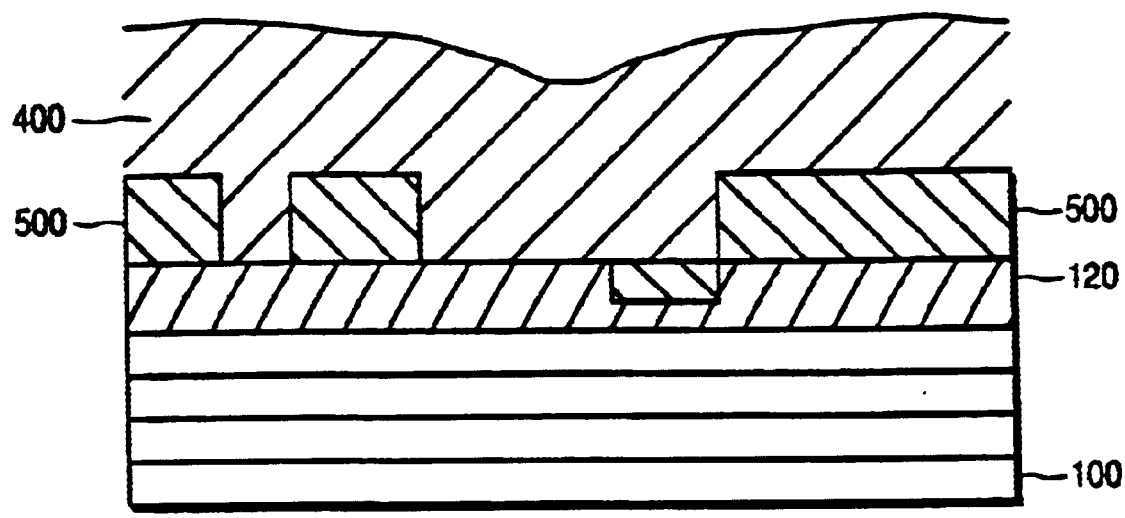
FIG. 10 illustrates the substrate of FIG. 9 after the silicon members have been converted into the absorption members.
Figure 11:
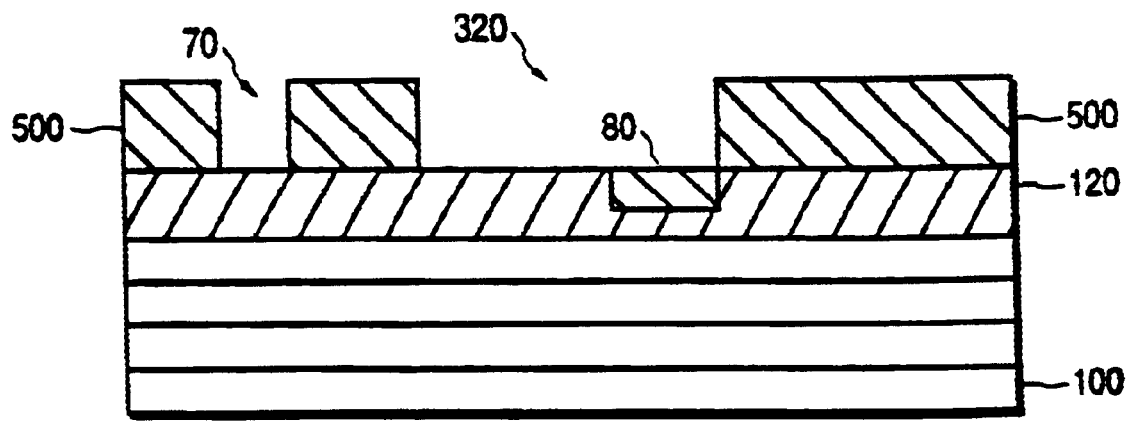
FIG. 11 illustrates the substrate of FIG. 10 after the metal has been etched.

After the opaque defect is repaired, a layer of nickel 400 is disposed over the silicon members 300, the reflective region 320, and the clear defect 70 as shown in FIG. 10. Thereafter, as shown in FIG. 11, absorption members 500 are formed and the excess nickel is removed by an etching process in the same way to that discussed above in connection with FIGS. 5 and 6.

Figure 12:
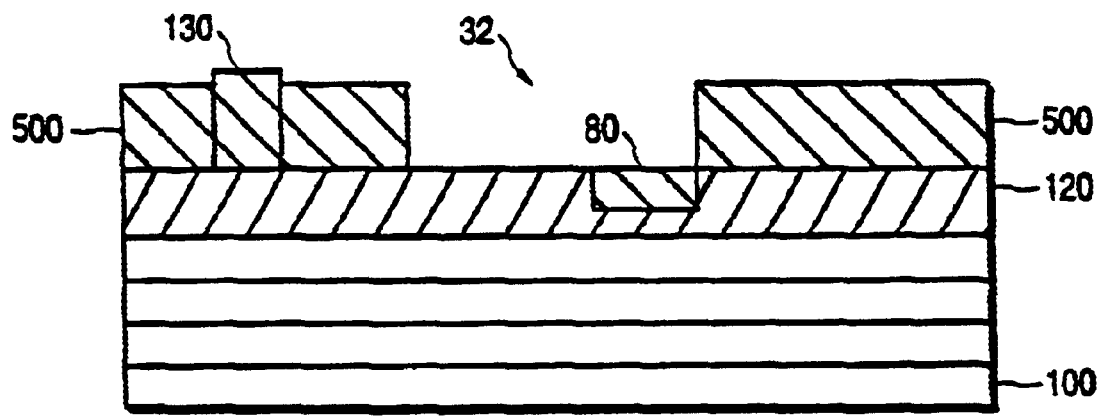
FIG. 12 illustrates the substrate of FIG. 11 after the clear defect has been repaired in the absorption member.

After the excess metal is removed, the clear defect 70 is repaired as depicted in FIG. 12. The clear defect can be repaired by placing the mask into a focused-ion beam system where a stream of ions fill the clear defect 70 region to form a patch 130. In the case of clear absorber intrusion mask defect, the deposition of the absorber is accomplished by introducing a metallo-organic gas (e.g., tungsten hexacarbonyl) at the specimen surface while the Ga+ beam is being rastered. The interaction between the ion beam and the gas induces metal decomposition and results in a localized metal vapor deposition on the mask surface in the region where the beam is being scanned. The patch 130 absorbs electromagnetic energy at a predetermined wavelength such as EUV for the embodiment under discussion.

Figure 13:
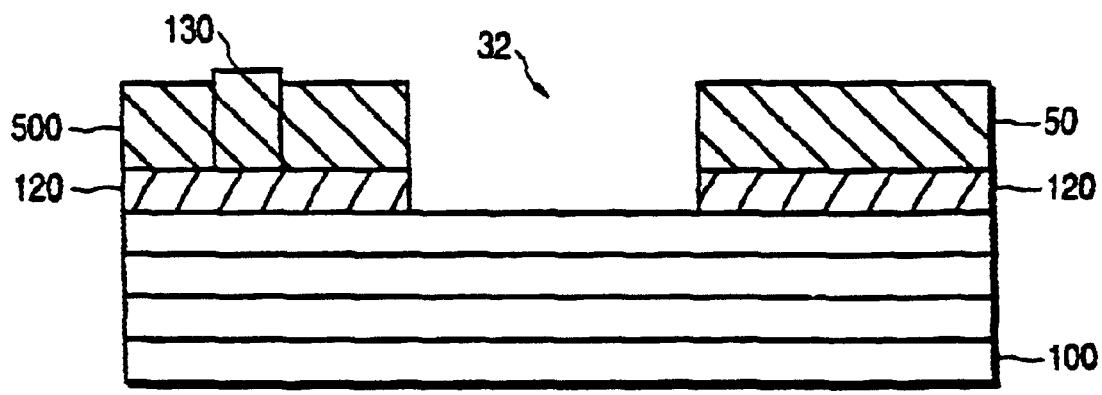
FIG. 13 illustrates the substrate of FIG. 12 after the metal and the oxide etch step layer have been etched.

FIG. 13 illustrates the mask after the portion of the etch stop layer 120 disposed between the reflective region 320 has been removed. The etch stop layer 120 can be removed by a diluted HF dip or by other processes well-known in the art.

The novel mask fabrication process described above provides improved critical dimension control over conventional metal film masks. This result is achieved by etching a layer of silicon to form silicon members and reflective regions and then converting the silicon members into a nickel silicide. In addition, defects in the mask are repaired, thus ensuring that an accurate image of the mask is cast onto a substrate.

We claim:

1. A photolithographic mask, comprising:
   a multilayer substrate;
   a plurality of absorption members disposed on a surface of the substrate forming a mask pattern, the absorption members comprising nickel silicide, wherein the silicide absorbs sufficient amount of electromagnetic energy having a predetermined wavelength to act as a mask; and
   a plurality of reflective regions disposed between the absorption members, wherein the reflective regions pass electromagnetic energy at the predetermined wavelength.

2. The mask defined by claim 1, wherein the silicide is approximately 500 to 800 angstroms thick.

3. The mask defined by claim 1, further comprising an oxide, the oxide being disposed between the substrate and the silicide.

4. The mask defined by claim 1, wherein the predetermined wavelength of electromagnetic energy is approximately 13.4 nanometers.

5. The mask defined by claim 1, wherein the absorption members absorb a portion of the electromagnetic energy.

* * * * *